United States Patent
Choi

(10) Patent No.: US 10,107,865 B2
(45) Date of Patent: Oct. 23, 2018

(54) BATTERY STATE ESTIMATION METHOD AND SYSTEM USING DUAL EXTENDED KALMAN FILTER, AND RECORDING MEDIUM FOR PERFORMING THE METHOD

(71) Applicant: Foundation of Soongsil University-Industry Cooperation, Seoul (KR)

(72) Inventor: Woojin Choi, Seoul (KR)

(73) Assignee: Foundation of Soongsil University-Industry Cooperation, Seoul (KR)

(*) Notice: Subject to any disclaimer, the term of this patent is extended or adjusted under 35 U.S.C. 154(b) by 351 days.

(21) Appl. No.: 14/736,640

(22) Filed: Jun. 11, 2015

(65) Prior Publication Data

US 2015/0377974 A1    Dec. 31, 2015

(30) Foreign Application Priority Data

Jun. 30, 2014  (KR) .................. 10-2014-0081076
Apr. 1, 2015   (KR) .................. 10-2015-0045886

(51) Int. Cl.
*G01R 31/36*    (2006.01)

(52) U.S. Cl.
CPC ...... *G01R 31/3651* (2013.01); *G01R 31/3606* (2013.01); *G01R 31/3679* (2013.01)

(58) Field of Classification Search
CPC ............ G01R 31/3651; G01R 31/3606; G01R 31/3679
See application file for complete search history.

(56) References Cited

U.S. PATENT DOCUMENTS 6,534,954 B1 * 3/2003 Plett .................. H01M 10/48
                                                320/132
7,525,285 B2 * 4/2009 Plett .................. H02J 7/0021
                                                320/132

(Continued)

FOREIGN PATENT DOCUMENTS

KR    10-2011-0118246 A    10/2011
KR    10-2013-0105123 A     9/2013

OTHER PUBLICATIONS

Van-Huan Duong et al. "Novel Estimation Technique for the State-of-Charge of the Lead-Acid Battery by using EFK Considering Diffusion and Hysteresis Phenomenon" The Transactions of the Korean Institute of Power Electronics, vol. 19, No. 2, pp. 139-148 (Apr. 2014).

(Continued)

*Primary Examiner* — Khamdan Alrobaie
(74) *Attorney, Agent, or Firm* — Novick, Kim, & Lee, PLLC; Sang Ho Lee

(57) ABSTRACT

Provided are a battery state estimation method and system and a recording medium for performing the method. The battery state estimation is provided by applying an ARX model and a dual extended Kalman filter. A battery state estimation system estimates a parameter of a battery model using an ARX model and estimates a battery state by applying the estimated parameter of the battery model to a dual extended Kalman filter including a state filter used to estimate a state of charge (SOC) and a weight filter used to estimate a state of health (SOH) of the battery.

13 Claims, 3 Drawing Sheets

(56) References Cited

U.S. PATENT DOCUMENTS

| | | | | |
|---|---|---|---|---|
| 7,593,821 B2* | 9/2009 | Plett | ............... | H01M 10/42 |
| | | | | 320/132 |
| 7,764,049 B2* | 7/2010 | Iwane | ............... | G01R 31/3651 |
| | | | | 320/132 |
| 8,937,459 B2* | 1/2015 | Park | ............... | G01R 31/361 |
| | | | | 320/149 |
| 2006/0100833 A1* | 5/2006 | Plett | ............... | H01M 10/48 |
| | | | | 703/2 |

OTHER PUBLICATIONS

Shifei Yuan et al., "State of charge estimation using the extended Kalman filter for battery management systems based on the ARX battery model", Energies, vol. 6, No. 1, Jan. 17, 2013, pp. 444-470.

S. J. Lee et al., "The State and Parameter Estimation of an Li-Ion Battery Using a New OCV-SOC Concept", Power Electronics Specialists Conference, Jun. 17, 2007, pp. 2799-2803.

Jonghoon Kim et al., "Complementary Cooperation Algorithm Based on DEKF Combined With Pattern Recognition for SOC/Capacity Estimation and SOH Prediction", IEEE Transactions on Power Electronics, Institute of Electrical and Electronics Engineers, USA, vol. 27, No. 1, Jan. 31, 2012, pp. 436-451.

* cited by examiner

BATTERY STATE ESTIMATION METHOD AND SYSTEM USING DUAL EXTENDED KALMAN FILTER, AND RECORDING MEDIUM FOR PERFORMING THE METHOD

CROSS-REFERENCE TO RELATED APPLICATION

This application claims priority to and the benefit of Korean Patent Application Nos. 10-2014-0081076, filed on Jun. 30, 2014, and 10-2015-0045886, filed on Apr. 1, 2015, the disclosure of which is incorporated herein by reference in its entirety.

BACKGROUND

1. Field of the Invention

The present disclosure relates to a battery state estimation method and system using a dual extended Kalman filter and a recording medium for performing the method, and more particularly, to a battery state estimation method and system using a dual extended Kalman filter and a recording medium for performing the method, in which a battery state may be calculated in consideration of hysteresis and diffusion phenomena.

2. Discussion of Related Art

Along with the rapid increase in demand for portable electronic products such as a notebook, a video camera, and a cell phone and the full-scale development of capacitors for storing energy, robots, and satellites, research is being conducted on high-performance secondary batteries that can be repeatedly charged and discharged.

Commercially available secondary batteries include a nickel-cadmium battery, a nickel-metal hydride battery, a nickel-zinc battery, a lithium secondary battery. From thereamong, the lithium secondary battery is getting the spotlight because the lithium secondary battery has almost no memory effect, and thus the lithium secondary battery provides several advantages e.g., charging/discharging with less memory effects, a high self-discharge rate, and a high energy density.

In particular, recently, as carbon energy is increasingly exhausted and public interest in the natural environment increases, the demand for hybrid vehicles and electric vehicles has been increased gradually and globally including in the United States, Europe, Japan, and South Korea. Such a hybrid or electric vehicle has been received a good response from market since the hybrid or electric vehicle is provided with a driving force from a battery pack by charging/discharging energy thereof. The hybrid or the electric vehicle is more energy efficient and reduces pollution emissions. Accordingly, a vehicle battery has been received attentions nowadays since the vehicle battery is regarded as an essential component of the hybrid or the electric vehicle.

Since a battery is used for various types of mobile devices such as a notebook or a vehicle and has a limited lifespan with proper functionality, it is important to measure accurate information on a state of charge (SOC) of the battery. The SOC is one of parameters as to how long the battery can last, and thus is very important information when a user uses a device receiving a power from the battery. Conventional battery-equipped devices such as a notebook, a cell phone, and a vehicle may estimate an SOC of the battery and then may provide the user with the information including an available time period or the charged amount of the battery on a basis of the estimated SOC.

The SOC of the battery is generally displayed in a form of a percentage of the remaining amount with respect to a full charge capacity (FCC) of the battery. A variety of methods of estimating the SOC of the battery may be used, and one of conventional methods is a method of estimating the SOC using the Coulomb counting method. The Coulomb counting method is a scheme of finding the SOC by accumulating input/output currents of the battery and adding/subtracting the accumulated currents to/from an initial capacity. However, the Coulomb counting method may provide a limited accuracy when there is an error in an initial value of the SOC or when an error of a measured current is accumulated over time. A method of estimating the SOC and a state of health (SOH) using a Kalman filter may be used to overcome the limitation. In order to increase an accuracy of the estimation, a battery module and its parameters should be accurate. The information of the changes in the parameters should be accurately considered. However, it is not easy to obtain such accurate information because it requires more time and equipment. Furthermore, if the type or capacity of the battery is not the same, a new test should be conducted again and it adds more trouble. In addition, for the parameters of the battery, the estimated accuracy of the SOC/SOH of the Kalman filter would be decreased as the battery is aging because their parameter values would be changed over time.

SUMMARY OF THE INVENTION

The present disclosure is directed to a battery state estimation method and system using a dual extended Kalman filter and a recording medium for performing the method, in which a battery parameter is estimated using an ARX model and a battery state is estimated by applying hysteresis and diffusion parameters.

According to one aspect of the present disclosure, a battery state estimation method includes estimating at least one of parameters of a battery according to an Auto Regressive with External Input (ARX) model, wherein the ARX defines a correlation among an output sequence y(t), an input sequence u(t), and a shift operator q, and estimating a battery state by applying the at least one of the parameters of the battery to a dual extended Kalman filter, wherein the dual extended Kalman filter comprises a state filter for calculating an estimate of a state of charge (SOC) of the battery and a weight filter for calculating an estimate of a state of health (SOH) of the battery.

The estimating the at least one of the parameters of the battery according to the ARX model further includes estimating the at least one of the parameters of the battery according to the following equation:

$$y(t) = \frac{B(q)}{A(q)}u(t) + \frac{1}{A(q)}e(t)$$

y(t) denotes the output sequence, u(t) denotes the input sequence, A(q) and B(q) denote polynomials with respect to the shift operator q, and e(t) denotes a white noise.

The battery has an equivalent circuit, wherein the equivalent circuit of the battery includes a first resistor, a second resistor, and a capacitor, wherein the first resistor is an internal resister, and wherein the second resistor and the capacitor are connected in parallel.

The estimating of the battery state by applying the at least one of the parameters of the battery to a dual extended Kalman filter further includes simultaneously estimating the state of charge (SOC) and the state of health (SOH) by the state filter, wherein the state filter uses a priori value of the weight filter, by the weight filter, wherein the weight filter uses a priori value of the state filter, or by an interaction between the state filter and the weight filter.

The estimating of the at least one of the parameters of the battery according to the ARX model further includes calculating and applying an open circuit voltage (OCV) in which a diffusion coefficient and a hysteresis coefficient are reflected in an application of the ARX model.

The calculating and applying of the OCV further includes calculating the OCV using the following equation:

$$OCV(SOC,\alpha,\zeta)=\alpha[(1-\zeta)OCV_{c3h}(SOC)+\zeta OCV_{c3m}(SOC)]+(1-\alpha)[(1-\zeta)OCV_{d3h}(SOC)+\zeta OCV_{d3m}(SOC)]$$

wherein $\zeta$ denotes a diffusion coefficient calculated by a first order exponential function during a relaxation time, and $\alpha$ denotes a hysteresis coefficient determined by normalized integration of a charge throughput, and wherein $OCV_{c3h}$(SOC) denotes a charged open circuit voltage (OCV) with 3-hour relaxation, $OCV_{c3m}$(SOC) denotes a charged open circuit voltage (OCV) with 3-minute relaxation, $OCV_{d3h}$(SOC) denotes a discharged open circuit voltage (OCV) with 3-hour relaxation, $OCV_{d3m}$(SOC) denotes a discharged open circuit voltage (OCV) with 3-minute relaxation.

According to another embodiment of the present disclosure, a control method of a battery state estimation system is provided. The control method includes performing initialization by inputting an initial value into a battery and measuring a current and a voltage input to the battery, calculating at least one of parameters including a first resistor, a second resistor, and a capacitor in the battery by inputting a hysteresis coefficient and a diffusion coefficient into an open circuit voltage (OCV) equation and using an Auto Regressive with External Input (ARX) algorithm that defines a correlation among an output sequence y(t), an input sequence u(t), and a shift operator q, wherein the first resistor is an internal resister, and applying a dual extended Kalman filter including a state filter and a weight filter to perform time and measurement updates to estimate a state of charge (SOC) and a state of health (SOH).

According to another embodiment of the present disclosure, a computer-readable recording medium storing a computer program for executing the control method of the battery state estimation system is provided. The control method includes performing initialization by inputting an initial value into a battery and measuring a current and a voltage input to the battery, calculating at least one of parameters including a first resistor, a second resistor, and a capacitor in the battery by inputting a hysteresis coefficient and a diffusion coefficient into an open circuit voltage (OCV) equation and using an Auto Regressive with External Input (ARX) algorithm that defines a correlation among an output sequence y(t), an input sequence u(t), and a shift operator q, wherein the first resistor is an internal resister; and applying a dual extended Kalman filter including a state filter and a weight filter to perform time and measurement updates to estimate a state of charge (SOC) and a state of health (SOH).

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
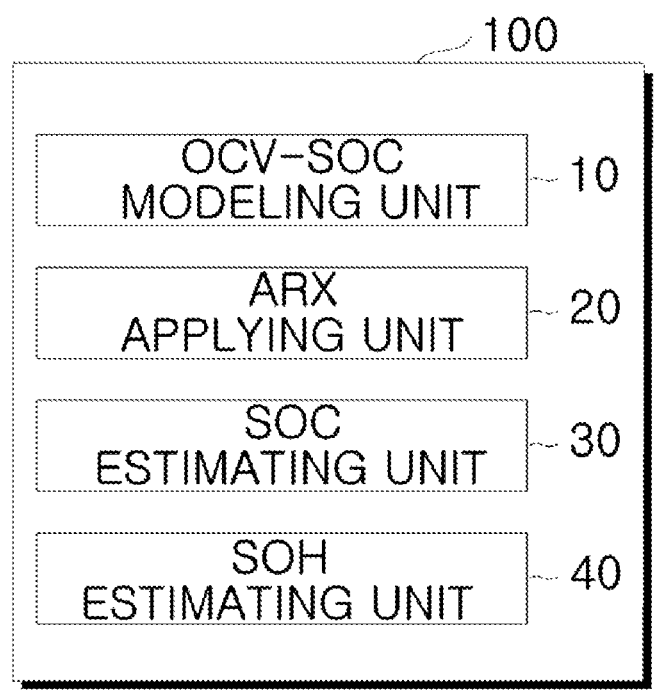
FIG. 1 is a block diagram illustrating a battery state estimation system according to an embodiment of the present disclosure.

In the following detailed description, reference is made to the accompanying drawings that show, by way of illustration, specific embodiments in which the present invention may be practiced. These embodiments are described in sufficient detail to enable those skilled in the art to practice the present invention. It is to be understood that the various embodiments of the present disclosure, although different, are not necessarily mutually exclusive. For example, a particular feature, structure or characteristic described herein in connection with one embodiment may be implemented within other embodiments without departing from the spirit and scope of the present disclosure. In addition, it is to be understood that the location or arrangement of individual elements within each disclosed embodiment may be modified without departing from the spirit and scope of the present invention. The following detailed description is, therefore, not to be viewed in a limiting sense, and the scope of the present disclosure is defined only by the appended claims, appropriately interpreted, along with the full range of equivalents to those claims. In the drawings, like numerals refer to the same or similar elements throughout the several views.

Hereinafter, some of embodiments of the present disclosure will be described in more detail with reference to the accompanying drawings.

Figure 2:
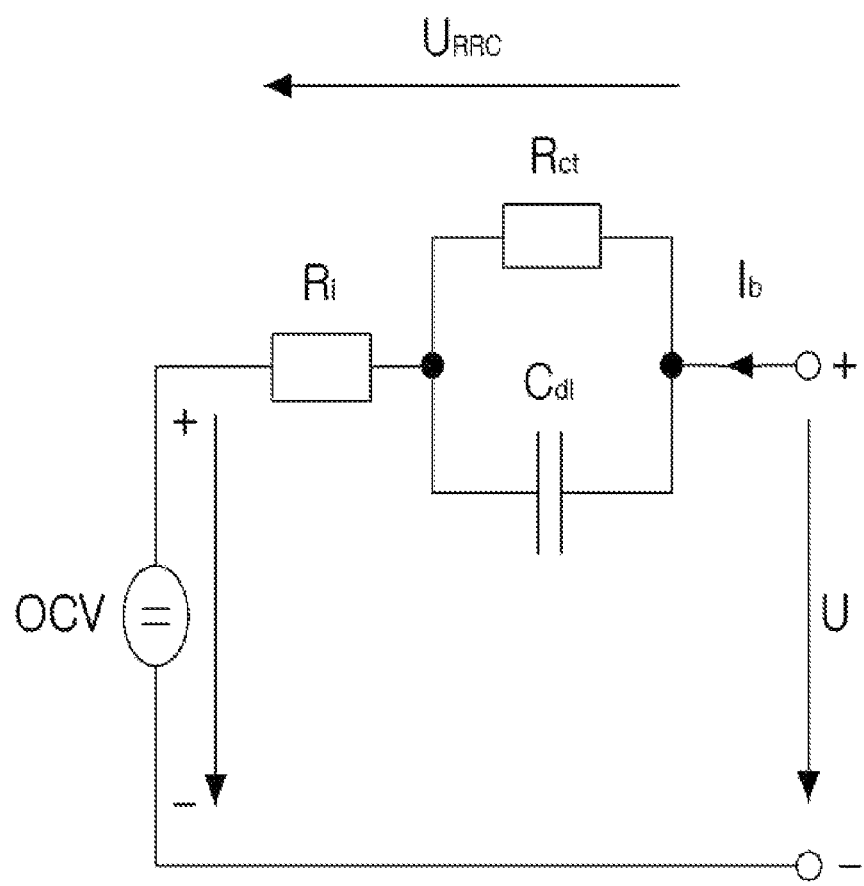
FIG. 2 is a block diagram of an equivalent circuit of a battery in which a SOC of the battery is calculated by the battery state estimation method according to the embodiment of the present disclosure.
Figure 3:
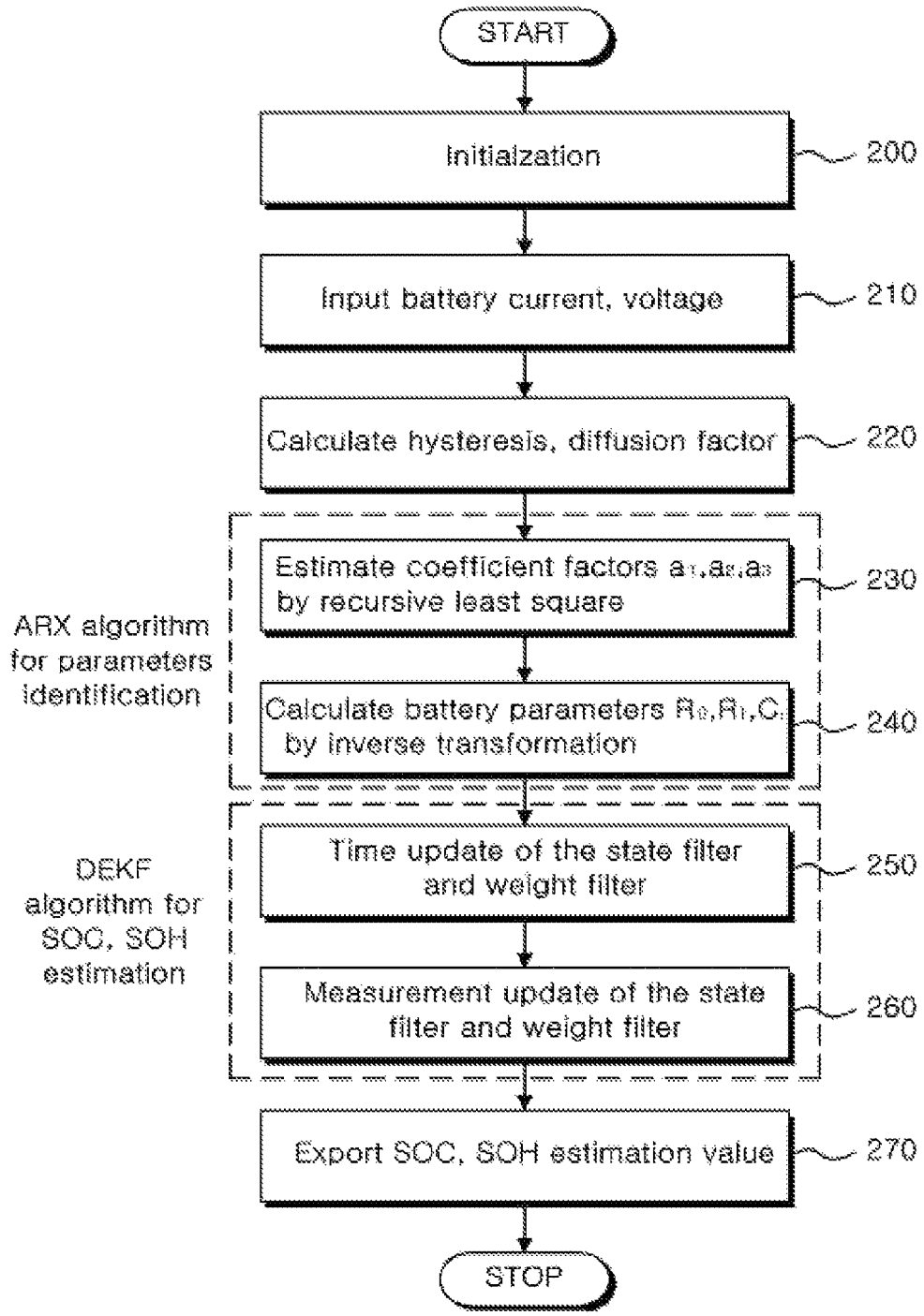
FIG. 3 is a flowchart of the battery state estimation system according to the embodiment of the present disclosure.

FIG. 1 is a block diagram illustrating a battery state estimation system 100 according to an embodiment of the present disclosure. FIG. 2 is a block diagram of an equivalent circuit of a battery in which a SOC of the battery is calculated by the battery state estimation method according to the embodiment of the present disclosure. FIG. 3 is a flowchart of the battery state estimation system 100 according to the embodiment of the present disclosure.

Referring to FIG. 1, the battery state estimation system 100 may include an OCV-SOC modeling unit 10, an ARX applying unit 20, an SOC estimating unit 30, and an SOH estimating unit 40.

Referring to FIG. 2, an equivalent circuit of a battery includes an internal resistor $R_i$, a resistor $R_{ct}$, and a capacitor $C_{dl}$, and the resistor $R_{ct}$ and the capacitor $C_{dl}$ are connected in parallel. The parallelly connected resistor $R_{ct}$ and capacitor $C_{dl}$ may include electronic elements such as a diffusion impedance, a charge transfer resistance, and a dual layer capacitor and may be set as time-varying parameters. A voltage applied to resistor $R_{ct}$ and capacitor $C_{dl}$, which are connected one another in parallel, may be another parameter of the battery equivalent circuit and may be set as a time-varying parameter. In the battery equivalent circuit, an open circuit voltage (OCV) and a battery terminal voltage may be set as time-varying parameters.

The OCV-SOC modeling unit 10 may extract an OCV equation that may calculate the open circuit voltage (OCV). The OCV equation may be calculated by considering parameters considering hysteresis and diffusion phenomena of a battery.

Here, the hysteresis phenomenon denotes a phenomenon in which, when the battery is charged and discharged, an open circuit voltage (OCV) value of a battery may be different for the same state of charge (SOC). The diffusion phenomenon denotes a voltage drop between a first reference time being a relaxation time needed for a battery terminal voltage to reach a stable state and a second reference time needed to remove a voltage drop at a $R_i$-$RctC_{dl}$ terminal of the battery equivalent circuit. In this case, the voltage drop may be defined as a diffusion overvoltage. The following description will be made on the assumption that the first reference time is set to be 3 hours and the second reference time is set to be 3 minutes. However, it should be appreciated that the first reference time and the second reference time may be set differently for each battery and may be set depending on an experiment result.

The OCV-SOC modeling unit 10 may define an OCV-SOC module including hysteresis and diffusion effects as the equation (1) below:

$$OCV(SOC,\alpha,\zeta)=\alpha[(1-\zeta)OCV_{c3h}(SOC)+\zeta OCV_{c3m}(SOC)]+(1-\alpha)[(1-\zeta)OCV_{d3h}(SOC)+\zeta OCV_{d3m}(SOC)] \quad (1)$$

where $\zeta$ denotes a diffusion coefficient calculated by a first order exponential function during a relaxation time and $\alpha$ denotes a hysteresis coefficient determined by normalized integration of a charge throughput. $OCV_{c3h}(SOC)$, $OCV_{c3m}(SOC)$, $OCV_{d3h}(SOC)$, and $OCV_{d3m}(SOC)$ are a charged OCV with 3-hour relaxation, a charged OCV with 3-minute relaxation, a discharged OCV with 3-hour relaxation, a discharged OCV with 3-minute relaxation, respectively.

The OCV value calculated by the OCV-SOC modeling unit 10 may be applied to Equation (12) below and then used by the ARX applying unit 20 to find a parameter of the battery equivalent module.

The ARX applying unit 20 may extract a parameter of the battery model of FIG. 2 using the equation (2) below:

$$y(t) = \frac{B(q)}{A(q)}u(t) + \frac{1}{A(q)}e(t) \quad (2)$$

y(t) denotes an output sequence, u(t) denotes an input sequence, A(q) and B(q) are polynomials with respect to a shift operator q, and e(t) denotes a white noise, which are defined as the equation (3) below:

$$A(q)=1+a_1q^{-1}+\ldots+a_nq^{-n},$$

$$B(q)=b_0+b_1g^{-1}+\ldots+b_mq^{-m}, \quad (3)$$

The ARX model is the simplest method which is associated with an input and an additive noise and may be applied to identify the battery parameters.

An n-th order linear time variant ARX module is expressed as the equation (4) below:

$$y(k)+a_1y(k-1)+\ldots+a_ny(k-n)=b_0u(k)+b_1u(k-1)+\ldots+b_mu(k-m)+e(k) \quad (4)$$

The equation (4) is a practical way of determining the network output value given by the previous observation and the prediction error, in which a and b are coefficients which may be expressed as the equation (5) below:

$$y(k)=a_1y(k-1)-\ldots a_ny(k-n)+b_0u(k)+b_1u(k-1)+\ldots+b_mu(k-m)+e(k) \quad (5)$$

For a more simplified expression, the equation (5) may be rewritten as the equation (6) below:

$$y(k)=\varphi^T(k)\theta(k-1)+e(k) \quad (6)$$

where $\theta=[a_1, \ldots, a_n, b_0, b_1, \ldots, b_m]^T$ and $\varphi(k)=[-y(k-1), \ldots, -y(k-n), u(k), u(k-1), u(k-m)]^T$.

An additive noise e(k) denotes an input as a direct noise in the equation (4) which is a difference equation. Parameters n and m denote an auto-regressive term and a moving average term which are used to simulate nonlinear cell dynamics. The equation (6) is linear with respect to $\theta$ and known in statistics as a linear regression.

An electrical behavior of the first order equivalent circuit shown in FIG. 2 may be expressed in a frequency domain using the equation (7) below:

$$U(s) = OCV(s) + I_b(s)R_i + I_b(s)\frac{R_{ct}}{(R_{ct}C_{dl})s+1} \quad (7)$$

where U is a battery terminal voltage, $I_b$ is a battery current with a positive value in a discharge state and with a negative value in a charge state, and s is a frequency operator.

A voltage $U_{RRC}$ of FIG. 2 is a voltage applied to $R_i$ and $R_{ct}$-$C_{dl}$ and may be expressed using the equation (8) below:

$$U_{RRC}(s) = U(s) - OCV(s) = I_b(s)R_i + I_b(s)\frac{R_{ct}}{(R_{ct}C_{dl})s+1} \quad (8)$$

A transfer function G(s) of Equation (7) may be expressed as the equation (9).

$$G(s) = \frac{U_{RRC}(s)}{I_b(s)} = R_i + \frac{R_{ct}}{(R_{ct}C_{dl})s+1} \quad (9)$$

$$= \frac{(R_iR_{ct}C_{dl})s + R_i + R_{ct}}{(R_{ct}C_{dl})s+1}$$

Applying a frequency operation method shown in the equation (10) to the transfer function G(s), a discrete transfer function of a battery system with a sample time T may be performed in the equation (11).

$$s = \frac{2}{T}\frac{1-z^{-1}}{1+z^{-1}}. \quad (10)$$

$$G(z^{-1}) = \frac{\frac{R_0T+R_1T+2R_0R_1C_1}{T+2R_1C_1} + \frac{R_0T+R_1T-2R_0R_1C_1}{T+2R_1C_1}z^{-1}}{1+\frac{T-2R_1C_1}{T+2R_1C_1}z^{-1}}$$

$$= \frac{a_2+a_3z^{-1}}{1+a_1z^{-1}}$$

where $$a_1 = \frac{(T-2R_{ct}C_{dl})}{(T+2R_{ct}C_{dl})}, \quad (11)$$

$$a_2 = \frac{(R_iT+R_{ct}T+2R_iR_{ct}C_{dl})}{(T+2R_{ct}C_{dl})},$$

and

-continued $$a_3 = \frac{(R_i T + R_{ct} T - 2R_i R_{ct} C_{dl})}{(T + 2R_{ct} C_{dl})}.$$

A time domain relationship between samples having different inputs/outputs is expressed as Equation (12).

$$U(k)-OCV(k)=a_1(U(k-1)OCV(k-1))+ a_2 I_b(k)+a_3 I_b(k-1) \quad (12)$$

where z is a discrete operator and OCV(k) denotes a value obtained by applying the diffusion coefficient and the hysteresis coefficient in the equation (1). The equation (12) is a specific form of the ARX model in the equation (5) for a first-order equivalent circuit model of FIG. 2 and is expressed as follows:

$$y(k)=a_1 y(k-1)+b_0 u(k)+b_1 u(k-1) \quad (13)$$

A recursive least square (RLS) algorithm which may track time variant parameters of a process dynamic model may be applied to calculate coefficient factors. When the RLS algorithm is applied, the next steps will be performed.

First, the prediction error of the voltage $U_{RRC}$ is expressed as the equation (14):

$$e(k)=U_{RRC}(k)-\varphi^T(k)\hat{\theta}(k-1) \quad (14)$$

where $\hat{\theta}$ is a calculated coefficient.

An update gain of the RLS algorithm is expressed as the equation (15) below:

$$L(k) = \frac{P(k-1)\varphi(k)}{\lambda(k) + \varphi^T(k)P(k-1)\varphi(k)} \quad (15)$$

where L is an update gain, P is a covariance, and λ is a temporary coefficient.

The calculated coefficient factor is expressed as the equation (16) below:

$$\hat{\theta}(k)=\hat{\theta}(k-1)+L(k)[U_{RRC}(k)-\varphi^T(k)\hat{\theta}(k-1)]. \quad (16)$$

A covariance matrix of the calculated coefficient factor is expressed as the equation (17) below:

$$P(k) = \frac{1}{\lambda(k)}\left[P(k-1) - \frac{P(k-1)\varphi(k)\varphi^T(k)P(k-1)}{\lambda(k)+\varphi^T(k)P(k-1)\varphi(k)}\right] \quad (17)$$

where $\varphi(k)=[-U_{RRC}(k-1), I_b(k), I_b(k-1)]^T$ and $\theta(k)=[a_1(k), a_2(k), a_3(k)]^T$.

$\varphi(k)$ is an input vector obtained from input data values including a time index k−1, the battery currents $I_b(k)$ and $I_b(k-1)$ at time steps k and k−1, and a dynamic effect voltage $U_{RRC}(k-1)$ for the battery parameters. θ(k) is a coefficient vector. λ(k) (0<λ<1) is a temporary coefficient which is used to assign more weight to recent data than the previous data.

The coefficient vector $\hat{\theta}(k)$ calculated at a time index k in the equation (16) may be updated by adding a correction to a coefficient vector at a time index k−1. Thus, the error of the coefficient vector is reduced. By checking $a_1(k)$, $a_2(k)$, and $a_3(k)$, the parameters of the battery model at each time step may be calculated using the equation (18) below:

$$R_i(k) = \frac{a_3(k) - a_2(k)}{a_1(k) - 1}, \quad (18)$$

-continued $$R_{ct}(k) = \frac{2a_1(k)a_2(k) - 2a_3(k)}{(a_1(k)-1)(a_1(k)+1)},$$

$$C_{dl}(k) = \frac{T(a_1(k)-1)^2}{4(a_3(k) - a_1(k)a_2(k))}.$$

The SOC may be estimated by applying a dual extended Kalman filter when the parameters of the battery module shown in FIG. 2 are extracted by the above-described methods. The dual extended Kalman filter may cause an accurate OCV of the battery of the ARX model to be calculated. The ARX model calculates parameter variables by the above-described method and provides information on the calculated variables to the dual extended Kalman filter.

The dual extended Kalman filter may be described by the equations (19) to (34). The dual extended Kalman filter may include two extended Kalman filters. One extended Kalman filter is a state filter, which is used to estimate an SOC, and the other is a weight filter which is used to estimate a battery SOH. The state filter may use a priori value of the weight filter, or the weight filter may use a priori value of the state filter. Thus, the two adaptive filters may interoperate and estimate the SOC and the SOH simultaneously.

A non-linear state space model may be expressed by the equations 19 and 20 below:

$$x_{k+1}=f(x_k, u_k, \theta_k)+w_k, \theta_{k+1}=\theta_k+r_k, \quad (19)$$

$$y_k=g(x_k, u_k, \theta_k)+v_k, d_k=g(x_k, u_k, \theta_k)+e_k \quad (20)$$

where $x_k$ is a battery model state, $\theta_k$ is a time-variant battery capacitance, $u_k$ is an external input, $y_k$ is a system output, $w_k$, $v_k$, $r_k$, and $e_k$ are independent Gaussian noise processing covariance matrices $Q_k^x$, $R_k^x$, $Q_k^\theta$, and $R_k^\theta$, respectively.

A state space equation that represents the SOC and the charge transfer voltage $V_{Cdl}$ may be expressed using the equations 21 to 23 below:

$$x_{k+1} = \begin{pmatrix} z_{k+1} \\ V_{Cdlk+1} \end{pmatrix} = \begin{pmatrix} 1 & 0 \\ 0 & 1-\frac{\Delta t}{R_{tc}C_{dl}} \end{pmatrix}\begin{pmatrix} z_k \\ V_{Cdlk} \end{pmatrix} + \left(-\frac{\eta_i \Delta t}{C_b} \quad \frac{\Delta t}{C_{dl}}\right)^T I_{b,k} + w_k, \quad (21)$$

$$U_k = OCV(z_k, \zeta_k, \alpha_k) + V_{Cdlk} + R_i I_{b,k} + v_k, \quad (22)$$

$$\theta_k = [C_{b,k}]. \quad (23)$$

A computing procedure for the dual extended Kalman filter may be summarized by the following equations.

In step 1, for k=0, initialization is performed.

$$\hat{\theta}_0^+ = E[x_0], \hat{P}_{\theta,0}^+ = E[(\theta_0 - \hat{\theta}_0^+)(\theta_0 - \hat{\theta}_0^+)^T]$$

$$\hat{x}_0^+ = E[x_0], \hat{P}_{x,0}^+ = E[(x_0 - \hat{x}_0^+)(x_0 - \hat{x}_0^+)]$$

where E[ ] is a statistical prediction operator.

In step 2, a nonlinear function is approximated through the equations (25) to (30):

$$F_{k-1} = \left.\frac{\partial f(x_{k-1}, u_{k-1}, \hat{\theta}_k^-)}{\partial x_{k-1}}\right|_{x_{k-1}=\hat{x}_{k-1}^+} = \begin{pmatrix} 1 & 0 \\ 0 & 1-\frac{\Delta t}{R_{tc}C_{dl}} \end{pmatrix}, \quad (25)$$

$$G_k^x = \left.\frac{\partial g(x_k, u_k, \hat{\theta}_k^-)}{\partial x_k}\right|_{x_k=\hat{x}_k^-} = \left[\sum_{i=0}^{4}(i+1)a_{i,k}(z_k^-)^i - 1\right], \quad (26)$$

-continued $$G_k^\theta = \frac{dg(x_k, u_k, \hat{\theta}_k^-)}{d\theta}\bigg|_{\theta=\hat{\theta}_k^-} = \frac{\partial g(\hat{x}_k^-, u_k, \theta)}{\partial \theta} + \frac{\partial g(\hat{x}_k^-, u_k, \theta)}{\partial \hat{x}_k^-}\frac{d\hat{x}_k^-}{d\theta}, \quad (27)$$

$$\frac{d\hat{x}_k^-}{d\theta} = \frac{\partial f(\hat{x}_{k-1}^+, u_{k-1}, \theta)}{\partial \theta} + \frac{\partial f(\hat{x}_{k-1}^+, u_{k-1}, \theta)}{\partial \hat{x}_k^+}\frac{d\hat{x}_{k-1}^+}{d\theta}, \quad (28)$$

$$\frac{d\hat{x}_{k-1}^+}{d\theta} = \frac{d\hat{x}_{k-1}^-}{d\theta} - L_{k-1}^x \frac{dg(\hat{x}_{k-1}^-, u_{k-1}, \theta)}{d\theta}. \quad (29)$$

Partial derivatives may be computed at respective time steps and computed recursively by initializing a final derivative to an initial value of zero.

Step 3 is a time update step using the equations (30) and (31) below:

$$\hat{x}_k^- = f(\hat{x}_{k-1}^+, u_{k-1}, \hat{\theta}_k^-)$$

$$P_{x,k}^- = F_{k-1} P_{x,k-1}^+ F_{k-1}^T + Q_k^x,$$

$$\hat{\theta}_k^- = \hat{\theta}_{k-1}^+$$

$$P_{\theta,k}^- = P_{\theta,k-1}^+ + Q_k^\theta.$$

Step 4 is a measurement update step. The state filter may be expressed as the equation (32), and the weight filter may be expressed as the equation (33):

$$K_k^x = P_{x,k}^- (G_k^x)^T [G_k^x P_k^- (G_k^x)^T + R_k^x]^{-1}$$

$$\hat{x}_k^+ = \hat{x}_k^- + K_k^x [y_k - g(\hat{x}_k^-, u_k, \hat{\theta}_k^-)]$$

$$P_{x,k}^+ = (I - K_k^x G_k^x) P_{x,k}^-,$$

$$K_k^\theta = P_{\theta,k}^- (G_k^\theta)^T [G_k^\theta P_k^- (G_k^\theta)^T + R_k^\theta]^{-1}$$

$$\hat{\theta}_k^+ = \hat{\theta}_k^- + K_k^\theta [y_k - g(\hat{x}_k^-, u_k, \hat{\theta}_k^-)]$$

$$P_{\theta,k}^+ = (I - K_k^\theta G_k^\theta) P_{\theta,k}^-$$

where $K_k^x$ and $K_k^\theta$ are Kalman gains, $\hat{x}_k^+$ is an SOC, $\hat{\theta}_k^+$ is an SOH, and $P_{x,k}^+$ and $P_{\theta,k}^+$ are covariance values. The SOC estimating unit 30 and the SOH estimating unit 40 may estimate an SOC and an SOH by the above-described method, respectively.

FIG. 3 is a flowchart of a battery state estimation system 100 according to an embodiment of the present disclosure.

The battery state estimation system 100 performs initialization with an initial value of zero (S200).

The battery state estimation system 100 measures and inputs a battery current and voltage (S210).

The battery state estimation system 100 calculates an OCV by inputting a hysteresis coefficient and a diffusion coefficient into an OCV calculation equation (S220).

The battery state estimation system 100 applies an ARX algorithm to calculate coefficient factors a1, a2, and a3 and compute parameters R0, R1, and C1 included in the battery model of FIG. 2 (S230 and S240).

The battery state estimation system 100 performs time and measurement updates on a state filter and a weight filter (S250 and S260).

The battery state estimation system 100 estimates SOC and SOH values (S270).

The battery state estimation method may be implemented as an application or implemented in the form of program instructions that may be executed through various computer components and recorded on a computer-readable medium. The computer-readable medium may include program instructions, data files, data structures, and the like individually or in combination.

The program instructions recorded on the medium may be specifically designed for the present disclosure.

Examples of the computer-readable recording medium include a magnetic medium such as a hard disk, a floppy disk, or a magnetic tape, an optical medium such as a compact disc-read only memory (CD-ROM) or a digital versatile disc (DVD), a magneto-optical medium such as a floptical disk, and a hardware device such as a ROM, a random access memory (RAM), or a flash memory that is specially designed to store and execute program instructions.

Examples of the program instructions include not only machine code generated by a compiler or the like but also high-level language codes that may be executed by a computer using an interpreter or the like. The hardware device described above may be constructed so as to operate as one or more software modules for performing the operations of the embodiments of the present disclosure, and vice versa.

According to one of embodiments of the present disclosure, it is possible to more accurately estimate an SOC and an SOH regardless of a fluctuation of drive conditions as the battery is aging. That is because an ARX model is used to extract at least one of parameters of a battery and applying the extracted parameters to a dual extended Kalman filter.

While the example embodiments of the present disclosure and their advantages have been described in details herewith, it should be understood that various changes, substitutions and alterations may be made herein without departing from the scope of the invention.

What is claimed is:

1. A battery state estimation method comprising:
   estimating at least one of parameters of a battery according to an Auto Regressive with External Input (ARX) model, wherein the ARX defines a correlation among an output sequence y(t), an input sequence u(t), and a shift operator q; and
   estimating a battery state by applying the at least one of the parameters of the battery to a dual extended Kalman filter,
   wherein the dual extended Kalman filter comprises a state filter for calculating an estimate of a state of charge (SOC) of the battery and a weight filter for calculating an estimate of a state of health (SOH) of the battery,
   wherein the estimating of the at least one of the parameters of the battery according to the ARX model comprises calculating and applying an open circuit voltage (OCV) in which a diffusion coefficient and a hysteresis coefficient are reflected in an application of the ARX model,
   wherein the calculating and applying of the OCV comprises calculating the OCV using the following equation:

OCV(SOC,α,ζ)=α[(1−ζ)OCVcfr(SOC)+ζOCVcsr(SOC)]+(1−α)[(1−ζ)OCVdfr(SOC)+ζOCVdsf(SOC)]

wherein ζ denotes a diffusion coefficient calculated by a first order exponential function during a relaxation time, and α denotes a hysteresis coefficient determined by normalized integration of a charge throughput, and wherein OCVcfr (SOC) denotes a charged open circuit voltage (OCV) with a first reference time, OCVcsr(SOC) denotes a charged open circuit voltage (OCV) with a second reference time, OCVdfr (SOC) denotes a discharged open circuit voltage (OCV)

with the first reference time, OCVdsr(SOC) denotes a discharged open circuit voltage (OCV) with the second reference time, wherein the battery has an equivalent circuit, wherein the equivalent circuit of the battery includes a first resistor ($R_i$), a second resistor ($R_{ct}$), and a capacitor ($C_{dl}$), wherein the first resistor ($R_i$) is an internal resister, and wherein the second resistor ($R_{ct}$) and the capacitor ($C_{dl}$) are connected in parallel, the first reference time is a time needed for a battery terminal voltage to reach a stable state and the second relaxation is a time needed to remove a voltage drop between the first resistor, and the second resistor and the capacitor ($R_i$–$RctC_{dl}$) of the battery equivalent circuit.

2. The battery state estimation method of claim 1, wherein the estimating the at least one of the parameters of the battery according to the ARX model further comprises estimating the at least one of the parameters of the battery according to the following equation:

$$y(t) = \frac{B(q)}{A(q)}u(t) + \frac{1}{A(q)}e(t)$$

wherein y(t) denotes the output sequence, u(t) denotes the input sequence, A(q) and B(q) denote polynomials with respect to the shift operator q, and e(t) denotes a white noise.

3. The battery state estimation method of claim 1, wherein the battery has an equivalent circuit, wherein the equivalent circuit of the battery includes a first resistor, a second resistor, and a capacitor, wherein the first resistor is an internal resister, and wherein the second resistor and the capacitor are connected in parallel.

4. The battery state estimation method of claim 1, wherein the estimating of the battery state by applying the at least one of the parameters of the battery to a dual extended Kalman filter further comprises simultaneously estimating the state of charge (SOC) and the state of health (SOH) by one of the followings:

the state filter, wherein the state filter uses a priori value of the weight filter, the weight filter, wherein the weight filter uses a priori value of the state filter, or an interaction between the state filter and the weight filter.

5. The battery state estimation method of claim 1, wherein the first reference time is 3 hours and the second reference time is 3 minutes.

6. A control method of a battery state estimation system, the control method comprising:

performing initialization by inputting an initial value into a battery and measuring a current and a voltage input to the battery;

calculating at least one of parameters including a first resistor, a second resistor, and a capacitor in the battery by inputting a hysteresis coefficient and a diffusion coefficient into an open circuit voltage (OCV) equation and using an Auto Regressive with External Input (ARX) algorithm that defines a correlation among an output sequence y(t), an input sequence u(t), and a shift operator q, wherein the first resistor is an internal resister; and applying a dual extended Kalman filter including a state filter and a weight filter to perform time and measurement updates to estimate a state of charge (SOC) and a state of health (SOH), wherein the OCV equation is the following equation:

OCV(SOC,α,ζ)=α[(1−ζ)OCVcfr(SOC)+ζOCVcsr(SOC)]+(1−α)[(1−ζ)OCVdfr(SOC)+ζOCVdsf(SOC)]

wherein ζ denotes a diffusion coefficient calculated by a first order exponential function during a relaxation time, and α denotes a hysteresis coefficient determined by normalized integration of a charge throughput, and wherein OCVcfr(SOC) denotes a charged open circuit voltage (OCV) with a first reference time, OCVcsr(SOC) denotes a charged open circuit voltage (OCV) with a second reference time, OCVdfr(SOC) denotes a discharged open circuit voltage (OCV) with the first reference time, OCVdsr(SOC) denotes a discharged open circuit voltage (OCV) with the second reference time, wherein the battery has an equivalent circuit, wherein the equivalent circuit of the battery includes a first resistor ($R_i$), a second resistor ($R_{ct}$), and a capacitor ($C_{dl}$), wherein the first resistor ($R_1$) is an internal resister, and wherein the second resistor ($R_{ct}$) and the capacitor ($C_{dl}$) are connected in parallel, the first reference time is a time needed for a battery terminal voltage to reach a stable state and the second relaxation is a time needed to remove a voltage drop between the first resistor, and the second resistor and the capacitor ($R_i$–$RctC_{dl}$) of the battery equivalent circuit.

7. The control method of claim 6, wherein the calculating of the at least one of the parameters using the ARX model further comprises using the following equation:

$$y(t) = \frac{B(q)}{A(q)}u(t) + \frac{1}{A(q)}e(t)$$

wherein y(t) denotes the output sequence, u(t) denotes the input sequence, A(q) and B(q) denote polynomials with respect to the shift operator q, and e(t) denotes a white noise.

8. The control method of claim 6, wherein the estimating of the battery state by applying the at least one of the parameters of the battery to a dual extended Kalman filter further comprises simultaneously estimating the state of charge (SOC) and the state of health (SOH) by one of the followings:

the state filter, wherein the state filter uses a priori value of the weight filter, the weight filter, wherein the weight filter uses a priori value of the state filter, or an interaction between the state filter and the weight filter.

9. The control method of claim 6, wherein the first reference time is 3 hours and the second reference time is 3 minutes.

10. A non-transitory computer-readable recording medium storing a computer program for executing the control method of the battery state estimation system, the control method comprising:

performing initialization by inputting an initial value into a battery and measuring a current and a voltage input to the battery;

calculating at least one of parameters including a first resistor, a second resistor, and a capacitor in the battery by inputting a hysteresis coefficient and a diffusion coefficient into an open circuit voltage (OCV) equation and using an Auto Regressive with External Input (ARX) algorithm that defines a correlation among an output sequence y(t), an input sequence u(t), and a shift operator q, wherein the first resistor is an internal resister; and applying a dual extended Kalman filter including a state filter and a weight filter to perform time and measurement updates to estimate a state of charge (SOC) and a state of health (SOH), wherein the OCV equation is the following equation:

OCV(SOC,α,ζ)=α[(1−ζ)OCVcfr(SOC)+ζOCVcsr(SOC)]+(1−α)[(1−ζ)OCVdfr(SOC)+ζOCVdsf(SOC)]

wherein ζ denotes a diffusion coefficient calculated by a first order exponential function during a relaxation time, and α denotes a hysteresis coefficient determined by normalized integration of a charge throughput, and wherein OCVcfr(SOC) denotes a charged open circuit voltage (OCV) with a first reference time, OCVcsr(SOC) denotes a charged open circuit voltage (OCV) with a second reference time, OCVdfr(SOC) denotes a discharged open circuit voltage (OCV) with the first reference time, OCVdsr(SOC) denotes a discharged open circuit voltage (OCV) with the second reference time, wherein the battery has an equivalent circuit, wherein the equivalent circuit of the battery includes a first resistor ($R_i$), a second resistor ($R_{ct}$), and a capacitor ($C_{dl}$), wherein the first resistor ($R_1$) is an internal resister, and wherein the second resistor ($R_{ct}$) and the capacitor ($C_{dl}$) are connected in parallel, the first reference time is a time needed for a battery terminal voltage to reach a stable state and the second relaxation is a time needed to remove a voltage drop between the first resistor, and the second resistor and the capacitor ($R_i$−Rct$C_{dl}$) of the battery equivalent circuit.

11. The non-transitory computer-readable recording medium of claim 10, wherein the calculating of the at least one of the parameters using the ARX model further comprises using the following equation:

$$y(t) = \frac{B(q)}{A(q)}u(t) + \frac{1}{A(q)}e(t)$$

wherein y(t) denotes the output sequence, u(t) denotes the input sequence, A(q) and B(q) denote polynomials with respect to the shift operator q, and e(t) denotes a white noise.

12. The non-transitory computer-readable recording medium of claim 10, wherein the estimating of the battery state by applying the at least one of the parameters of the battery to a dual extended Kalman filter further comprises simultaneously estimating the state of charge (SOC) and the state of health (SOH)
    by the state filter, wherein the state filter uses a priori value of the weight filter,
    by the weight filter, wherein the weight filter uses a priori value of the state filter, or
    by an interaction between the state filter and the weight filter.

13. The non-transitory computer-readable recording medium of claim 10, wherein the first reference time is 3 hours and the second reference time is 3 minutes.

* * * * *